(12) United States Patent
Smeys et al.

(10) Patent No.: US 8,609,486 B1
(45) Date of Patent: Dec. 17, 2013

(54) METHODS FOR FABRICATING DEEP TRENCH CAPACITORS

(75) Inventors: Peter Smeys, San Jose, CA (US); Charu Sardana, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/345,630

(22) Filed: Jan. 6, 2012

(51) Int. Cl.
  *H01L 21/8242* (2006.01)
(52) U.S. Cl.
  USPC .......................................... 438/243
(58) Field of Classification Search
  USPC .................. 438/142, 197, 238, 239, 243, 270; 257/E27.092, E27.095, E29.346
  See application file for complete search history.

(56) References Cited

U.S. PATENT DOCUMENTS

| | | | |
|---|---|---|---|
| 4,912,535 A * | 3/1990 | Okumura .................... | 257/301 |
| 6,964,926 B2 * | 11/2005 | Huang et al. .................. | 438/700 |
| 7,575,970 B2 | 8/2009 | Ho et al. | |
| 7,705,411 B2 * | 4/2010 | Smeys et al. ................. | 257/415 |
| 7,923,815 B2 | 4/2011 | Wang et al. | |
| 2006/0017115 A1 * | 1/2006 | Tu et al. ........................ | 257/371 |
| 2011/0165755 A1 * | 7/2011 | Zundel et al. ................. | 438/386 |
| 2011/0272702 A1 | 11/2011 | Kwon et al. | |
| 2011/0298089 A1 * | 12/2011 | Krishnan et al. .............. | 257/532 |
| 2012/0202327 A1 * | 8/2012 | Lehnert et al. ................ | 438/270 |

OTHER PUBLICATIONS

Khor, Chin Hieang. U.S. Appl. No. 13/175,724, filed Jul. 1, 2011.
Wong, Wilson, et al. U.S. Appl. No. 12/909,739, filed Oct. 21, 2010.
Butt et al. "A 0.039um ʌ 2 High Performance eDRAM Cell based on 32nm High-K/Metal 501 Technology." IEDM [online] (Abstract), Dec. 6, 2010 [retrieved on Jan. 12, 2011]. Retrieved from the Internet<http://ieeexplore.ieee.org/xpl/freeabs_all.jsp?arnumber=5703434>.

* cited by examiner

*Primary Examiner* — Tom Thomas
*Assistant Examiner* — Nicholas J Choi
(74) *Attorney, Agent, or Firm* — Treyz Law Group; Jason Tsai

(57) ABSTRACT

Integrated circuits with transistors and decoupling capacitor structures are provided. A decoupling capacitor structure may include multiple deep trench structures formed in a semiconductor substrate. The deep trench structures may each be lined with high-κ dielectric material. A conductive metal layer for use in controlling threshold voltages associated with n-channel or p-channel devices may be formed over the high-κ dielectric liner. Conductive material such as aluminum may be used to fill the remaining trench cavity. The high-κ dielectric liner may be simultaneously deposited into the deep trench structures and gate regions of the transistors. In one suitable arrangement, the deep trench structures and transistor metal gates for at least a selected type of transistors may be formed in parallel. In another suitable arrangement, the deep trench structures and the transistor metal gates may be formed in separate steps.

20 Claims, 7 Drawing Sheets

METHODS FOR FABRICATING DEEP TRENCH CAPACITORS

BACKGROUND

This relates generally to integrated circuits, and more particularly, to integrated circuits with decoupling capacitors.

Decoupling capacitors are often used to help provide more stable power supply voltages to circuitry on an integrated circuit. Decoupling capacitors shunt high frequency noise on direct current (DC) power supply lines to ground power supply lines, thereby preventing the noise from reaching circuit components on the integrated circuit. In a scenario in which a power supply is required to switch between different modes of operation, an adequate decoupling capacitance can act as an energy reserve that lessens the magnitude of undesired dips in power supply voltage during mode switching events.

Advances in integrated circuit design require power supplies to supply stable power for integrated circuits operating at high data rates and clock speeds. This requires increasing amounts of decoupling capacitance per unit integrated circuit area. A large decoupling capacitance could occupy a disproportionate amount of valuable surface area on an integrated circuit.

A convention decoupling capacitor (commonly referred to as a planar decoupling capacitor) includes two doped oxide definition (OD) regions formed in a semiconductor substrate. The two OD regions are separated by an intervening region (i.e., a region that is part of the substrate). A single continuous layer of conductive gate material is disposed over the intervening region. A layer of dielectric material (i.e., silicon dioxide) is interposed between the surface of the intervening region in the substrate and the layer of conductive gate material. The layer of conductive gate material serves as a first conductive plate for the decoupling capacitor, whereas the surface of the intervening region that faces the conductive gate material serves as a second conductive plate for the decoupling capacitor. Integrated circuits that include such types of decoupling capacitors may have a significant portion of available die space occupied by decoupling capacitor circuitry.

Strict polysilicon density requirements in modern fabrication processes, however, do not permit the formation of decoupling capacitors that have large continuous layers of conductive gate material (i.e., capacitive structures need to be split into more than two oxide definition regions having multiple thinner conductive gate structures connected in parallel). Forming planar decoupling capacitors with split OD regions and multiple parallel-connected gate structures may undesirably decrease the capacitance per unit area of the decoupling capacitors.

SUMMARY

Integrated circuits may include decoupling capacitor structures (sometimes referred to as "decap" circuitry). The decoupling capacitor structures may be used to reduce the amount of power supply noise present on power supply lines. The decoupling capacitor structures may be organized in groups of decoupling capacitors (sometimes referred to as blocks). The decoupling capacitors in each block may be arranged in an array with multiple rows and columns of decoupling capacitors. The decoupling capacitor blocks may have different sizes and shapes and may exhibit different capacitance values.

A decoupling capacitor may include multiple deep trench structures formed in a semiconductor substrate (e.g., a p-type silicon substrate). A doped well such as a p-well or an n-well may be formed in the substrate. Dielectric material such as silicon oxide may be formed on top of the substrate. A deep trench structure may penetrate a portion of the silicon oxide layer and extend deep into the substrate (e.g., the trench may extend well beyond the depth of the associated p-well or n-well). The deep trench structure may have sidewalls that are lined with high-K dielectric material (e.g., hafnium oxide). A conductive layer that is used for controlling threshold voltages for n-channel or p-channel transistors (sometimes referred to as a threshold voltage control layer) may be formed on top of the high-κ dielectric liner. Conductive fill material such as aluminum may be used to fill any remaining cavity in each deep trench structure.

The high-κ dielectric liner associated with the deep trench structures of the decap circuitry and gate structures of the transistors may be simultaneously deposited using atomic layer deposition (ALD), as an example. In one suitable embodiment of the present invention, the threshold voltage control layer and the fill material associated with the deep trench structures and the transistor gate structures may be formed in parallel. In another suitable embodiment of the present invention, the threshold voltage control layer and the fill material associated with the deep trench structures and the transistor gate structures may be formed in separate processing steps. Forming deep trench high-κ metal gate decoupling capacitor structures in this way may provide capacitive structures exhibiting high capacitance per unit area while keeping the manufacturing costs at manageable levels (without substantially increasing processing complexity).

Further features of the present invention, its nature and various advantages will be more apparent from the accompanying drawings and the following detailed description.

DETAILED DESCRIPTION

Embodiments of the present invention relate to integrated circuits with decoupling capacitor circuitry. Integrated circuits include on-chip circuitry that is powered using external power supplies. The external power supplies may be used to supply integrated circuits with power supply voltages. It is generally desirable to maintain the power supply voltages at constant voltage levels (e.g., to minimize power supply voltage variation).

The amount of power drawn from a power supply may vary during normal operation of an integrated circuit. To accommodate this type of changing power demand while maintaining constant power supply voltage levels, the integrated circuit may include decoupling capacitor circuitry. The decoupling capacitor circuitry may serve as a local energy storage reserve that provides instantaneous current draw. Providing current using the decoupling capacitor circuitry may reduce power supply noise.

Figure 1:
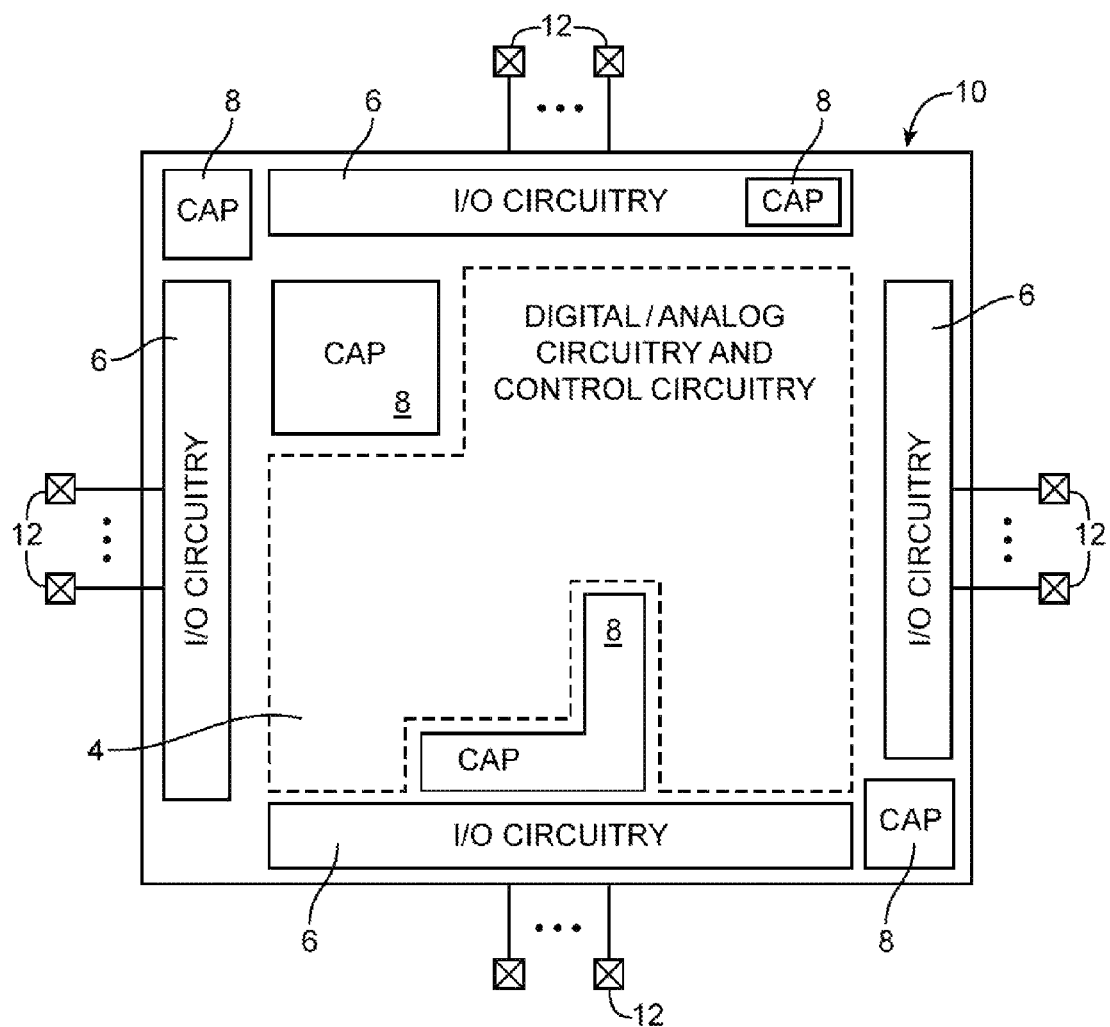
FIG. 1 is a diagram of an illustrative integrated circuit with decoupling capacitor circuitry in accordance with an embodiment of the present invention.

FIG. 1 shows an integrated circuit that includes internal circuitry such as digital/analog circuitry and control circuitry 4. Integrated circuit 10 may be memory chips, digital signal processing circuits, microprocessors, application specific integrated circuits, programmable integrated circuits, or other suitable integrated circuits.

As shown in FIG. 1, integrated circuit 10 may include input-output (I/O) circuitry such as I/O circuitry 6 formed along each edge of integrated circuit 10. Circuitry 6 may be used for driving signals off of device 10 and for receiving signals from other devices via I/O pins 12.

As shown in FIG. 1, device 10 may also include blocks of decoupling capacitors such as decoupling capacitor blocks 8. Decoupling capacitor blocks 8 may each include an array of decoupling capacitors. Decoupling capacitor blocks 8 of varying configurations (e.g., decoupling capacitor blocks 8 of different sizes and shapes) may be formed on device 10. Decoupling capacitor blocks 8 may also be formed from combinations of different types of capacitors (e.g. thin oxide capacitors and thick oxide capacitors), if desired. Decoupling capacitor blocks 8 may be formed in many locations (e.g. adjacent to I/O circuitry 6, as an integral part of I/O circuitry 6, adjacent to circuits 4 that are sensitive to power supply variation, or at any desired location on device 10). Tens or hundreds of decoupling capacitor array blocks 8 may be formed on device 10, if desired.

Decoupling capacitor blocks 8 may serve to reduce power supply variation at the respective locations on device 10. For example, consider a scenario in which an external power source supplies a 1.2 V positive power supply voltage to device 10. Device 10 may include communications circuitry 4 operating at high data rates (e.g., data rates greater than 1 Gbps). During an idle mode, communications circuitry 4 may draw 0.5 A of current from the power source (as an example). During transmit mode, the communications circuitry may draw 0.7 A of current from the power source. During the switching operations from the idle mode to the transmit mode, decoupling capacitor block 8 located adjacent to communications circuitry 4 on device 10 may serve to provide 0.2 A of current (0.7-0.5) so that communications circuitry 8 receives a constant positive supply voltage of 1.2 V.

Consider another scenario in which the positive power supply experiences an instantaneous voltage glitch. Decoupling capacitor blocks 8 may dampen or absorb this glitch by providing instantaneous current to internal circuitry 4 so that the positive power supply voltage received at the local power supply terminal of circuitry 4 remains constant at 1.2 V (as an example). Decoupling capacitor circuitry 8 used to maintain constant power supply voltage while supplying the desired current draw may be referred to as a ballasting circuit.

Decoupling capacitor blocks 8 formed on device 10 may have large dimensions. For example, a single decoupling capacitor array 8 may measure 400 μm by 200 μm and may have one hundred or more, one thousand or more, or ten thousand or more individual capacitor cells. The size of decoupling capacitor circuitry 8 in modern integrated circuits may occupy a significant percentage of the available die area (e.g., from three to fifteen percent or more).

Decoupling capacitor blocks 8 formed on device 10 may include any suitable combination of thin oxide decoupling capacitors, thick oxide decoupling capacitors, or other suitable decoupling capacitors. For example, decoupling capacitor blocks 8 near circuitry supplied with high power supply voltages (e.g., I/O circuitry 6) may include more thick oxide decoupling capacitors than thin oxide decoupling capacitors (if any), whereas decoupling capacitor blocks 8 near circuitry supplied with low power supply voltages (e.g. digital circuitry 4) may include more thin oxide decoupling capacitors than thick oxide decoupling capacitors (if any).

Figure 2:
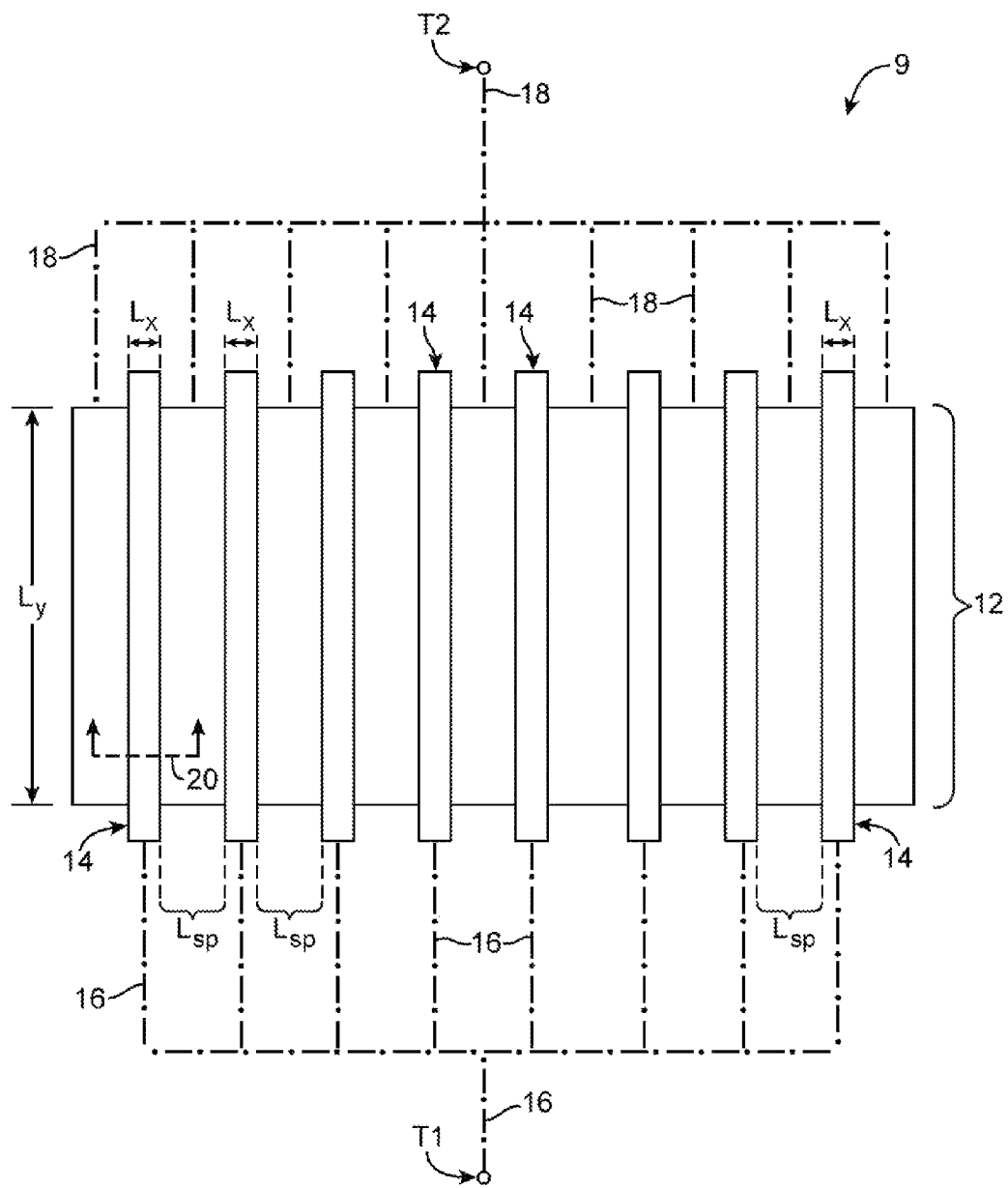
FIG. 2 is a top layout view of an illustrative decoupling capacitor in accordance with an embodiment of the present invention.

Each decoupling capacitor block 8 on device 10 may include tens or hundreds of individual decoupling capacitor structures 9 (see, e.g., FIG. 2). As shown in FIG. 2, decoupling capacitor structure 9 may include a well region 12 (sometimes referred to as an oxide definition region) formed in a semiconductor substrate (e.g., a p-type silicon substrate). Regions in the substrate that are not active well regions may be occupied by shallow trench isolation (STI) structures, field oxide structures, or other types of isolation structures. Region 12 may, for example, be an n-well region (e.g., a region in the substrate that is lightly doped with n-type dopants), p-well region (e.g., a region in the substrate that is lightly doped with p-type dopants), or other doped regions. Region 12 may have a width Ly.

Decoupling capacitor structure 9 may include multiple conductive trench structures 14 formed in region 12. In general, decoupling capacitor structure 9 may have an even number of trench structures 14, an odd number of trench structures 14, or any desired number of trench structures formed in a given region 12. Conductive trench structures 14 may each be formed in an orientation that is parallel to width Ly and may each have a trench width Lx. Each pair of adjacent trench structures 14 may be separated by minimum required spacing Lsp (e.g., a minimum poly-to-poly spacing requirement) that satisfies design rules associated with the current fabrication process being used to manufacture device 10.

Decoupling capacitor 9 may have first and second terminals (or ports). Each of trench structures 14 may be shorted together using conductive paths 16 to collectively serve as the first terminal (T1) for decoupling capacitor structure 9. Portion of regions 12 that are not occupied by trench structures 14 may be shorted together using conductive paths 18 to collectively serve as the second terminal (T2) for decoupling capacitor structure 9.

Figure 3:
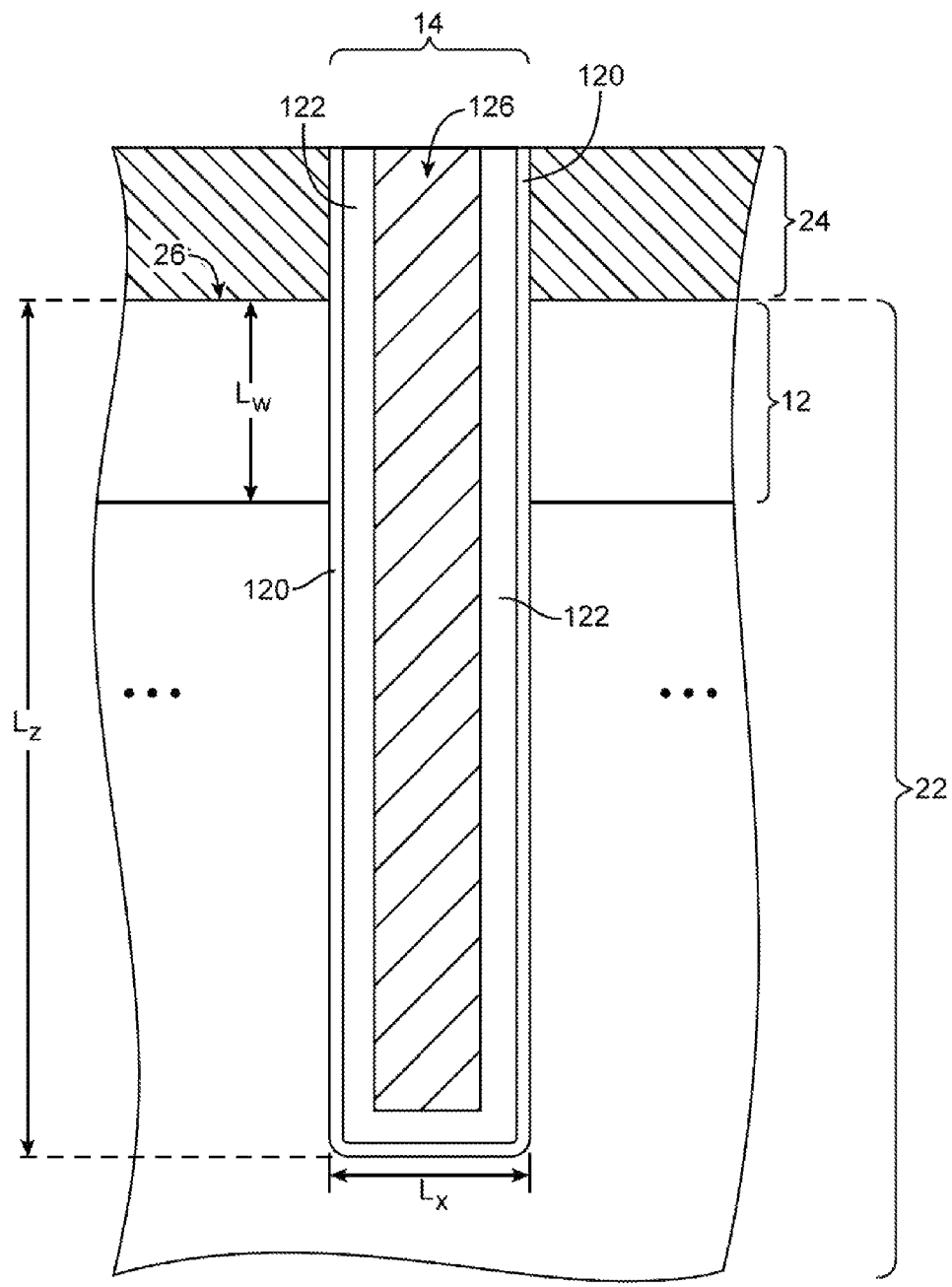
FIG. 3 is a cross-sectional side view of an illustrative trench that forms part of the decoupling capacitor of FIG. 2 in accordance with an embodiment of the present invention.

FIG. 3 is a cross-sectional side view of trench structure 14. Trench 14 may be formed in semiconductor substrate 22 (e.g., a p-type silicon substrate). A layer of dielectric material 24 (e.g., silicon oxide or other insulating material) may be formed on surface 26 of substrate 22. As shown in FIG. 3, trench structure 14 may penetrate through a portion of oxide layer 24 and extend deep into substrate 22. The depth Lz to which trench structure 14 extends below surface 26 of substrate 22 may be 15 times greater than the depth Lw to which well region 12 extends below surface 26 of substrate 22 (as an example). Consider a scenario in which substrate 22 has a thickness of 100 μm. Depth Lw associated with region 12 may be equal to 0.1 μm, whereas depth Lz associated with trench structure 14 may be equal to 1.5 μm. Trench 14 extending well beyond the depth of well region 12 into substrate 22 may therefore sometimes be referred to as a "deep" trench structure.

The ratio of trench depth Lz to trench width Lx may sometimes be referred to as a trench aspect ratio. Deep trench structure 14 may have an aspect ratio of at least 5:1, at least 10:1, at least 15:1, at least 35:1, etc.

Trench 14 may be lined using layer 120 that includes a layer of silicon oxide (e.g., silicon dioxide $SiO_2$) and a layer of high-κ dielectric material (e.g., hafnium oxide $HfO_2$). For example, the layer of silicon dioxide may exhibit a dielectric constant κ of 3.9, whereas the layer of hafnium oxide may exhibit a relative high dielectric constant κ of 23. The use of high-κ material in trench structure 14 allows the gate oxide thickness to be increased without a reduction in capacitance, thereby reducing undesired leakage effects that plague conventional planar capacitors formed using relatively thinner low-κ dielectric materials. The layer of silicon oxide may have a thickness of 10 Å, whereas the layer of hafnium oxide may have a thickness of 50 Å (as an example). The layer of hafnium oxide may be formed on top of the layer of silicon oxide. If desired, the layer of silicon oxide may be formed on top of the layer of hafnium oxide, the layer of silicon oxide may be thicker than the layer of hafnium oxide, and/or other types of high-κ dielectric material may be used in trench structure 14.

A conductive layer such as layer 122 may be stacked on top of dielectric layer 120. Layer 122 may be formed using titanium nitride TiN (as an example). Layer 122 may sometimes be referred to as a metal gate layer. Two different types of layer 122 may be used in forming capacitor trenches and transistors on device 10. The first type of layer 122 may be suitable for n-channel devices (e.g., devices formed in p-wells), whereas the second type of layer 122 may be suitable for p-channel devices (e.g., devices formed in n-wells). Metal gate material of the first type may therefore sometimes be referred to as N-metal, whereas metal gate material of the second type may sometimes be referred to as P-metal. Layer 122 may suitably be bonded to layer 120 and may serve to control the threshold voltage associated with n-channel and p-channel transistors. Conductive fill material 126 such as aluminum may be formed over layer 122 to fill the remaining void (cavity) in trench structure 14.

The exemplary configuration of decoupling capacitor trench structure 14 described herein is merely illustrative and does not serve to limit the scope of the present invention. If desired, trench structure 14 may extend any suitable depth Lz into the substrate, may have any suitable aspect ratio, and may be filled with any suitable conductive materials. Deep trench structures 14 in decoupling capacitor structure 9 formed using this arrangement may offer high capacitance density (e.g., high capacitance per unit area) compared to conventional planar capacitive structures. Decoupling capacitors 9 having such types of trench structures may therefore sometimes be referred to as deep trench high-κ metal gate capacitive structures.

Figure 4:
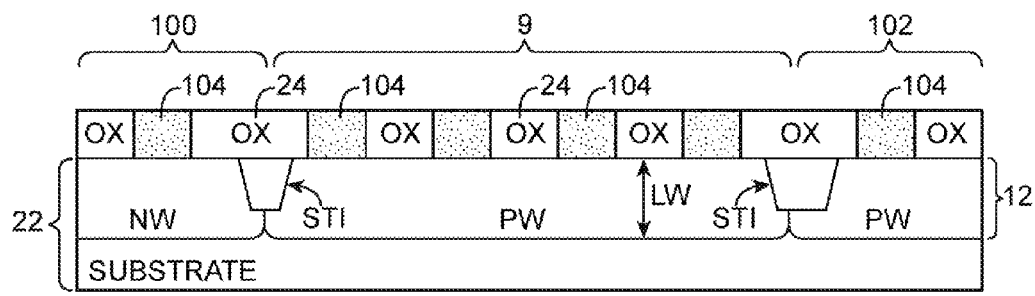
FIGS. 4-6 are cross-sectional side views showing illustrative steps involved in forming the decoupling capacitor of FIG. 2 in accordance with an embodiment of the present invention.
Figure 5:
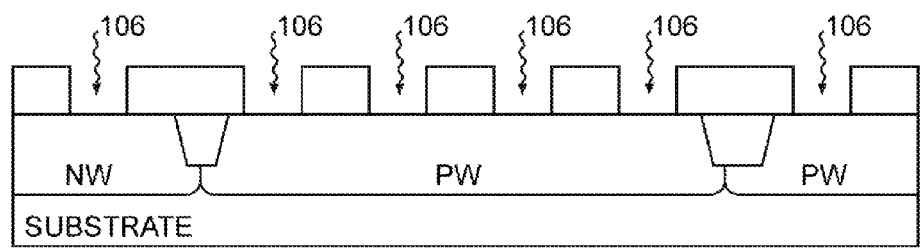
Figure 6:
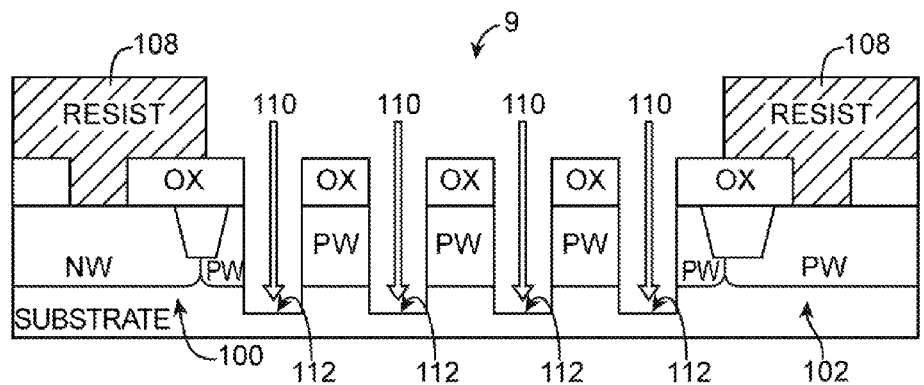

FIGS. 4-6 show illustrative steps involved in forming transistors and decoupling capacitor structure 9. FIG. 4 is a cross-sectional side view showing an intermediate step in the complementary metal-oxide-semiconductor (CMOS) process used in manufacturing circuitry on device 10. As shown in FIG. 4, p-channel transistor 100, n-channel transistor 102, decoupling capacitor (or decap) structure 9, and other integrated circuit structures may be formed in substrate 22. P-channel transistor 100 may be formed in an n-well (NW), whereas n-channel transistor 102 may be formed in a p-well (PW). In this example, decap structure 9 is formed in a p-well. In other suitable embodiments, decap structure 9 may be formed in an n-well. As described previously, well regions 12 may extend a depth of Lw below the surface of substrate 22.

Isolation structures such as shallow trench isolation structures (STI) may be interposed between two adjacent devices to provide electrical isolation.

Density compliance structures such as polysilicon (or poly) gate structures 104 may be formed on selected portions of substrate 22. Polysilicon density requirements for a given process require that the polysilicon density per unit area of an integrated circuit layout meet certain threshold requirements (i.e., the polysilicon density per unit area must be greater than a first threshold value, and the polysilicon density per unit area must be less than a second threshold value). Density-compliance structures 104 may be used to satisfy polysilicon density requirements.

At least one poly structure 104 may be formed in each of transistors 100 and 102. Decap structure 9 may include four poly structures 104 (as shown in FIG. 4), may include less than four or more than four poly structures, if desired. Regions on substrate 22 that are devoid of polysilicon structures 104 may be occupied by field oxide (0x) material 24.

Polysilicon structures 104 may then be removed using wet or dry etching techniques, as indicated by arrows 106 in FIG. 5. Regions on substrate 22 where structures 104 have been removed may leave behind cavities. In a subsequent step, a photoresist mask 108 may be selectively formed over regions on device 10 that are not part of a decoupling capacitor structure (see, e.g., FIG. 6). In the example of FIG. 6, resist layer 108 may be formed to cover transistors 100 and 102 and other transistors on device 10, whereas regions on device 10 that are associated with decap structures 9 are left exposed.

Trench cavities 112 may then be formed by selectively etching into silicon substrate 22, as shown by arrow 110. Oxide layer 24 may serve as a "hard" mask that is resistant to the etchants introduced during this step. As an example, an anisotropic plasma etching process may be used (e.g., using plasma etchants such as sulfur hexafluoride, nitrogen trifluoride, dichlorodifluoromethane, etc.) to selectively etch into substrate 22. As another example, an anisotropic wet etching process may be used (e.g., using wet etchants such as nitric acid, hydrofluoric acid, or other acids) to selectively form trench cavities 112. Trench cavities may be approximately 1 μm deep (as an example). Resist layer 108 may be stripped after trench cavities 110 have been formed.

Figure 7A:
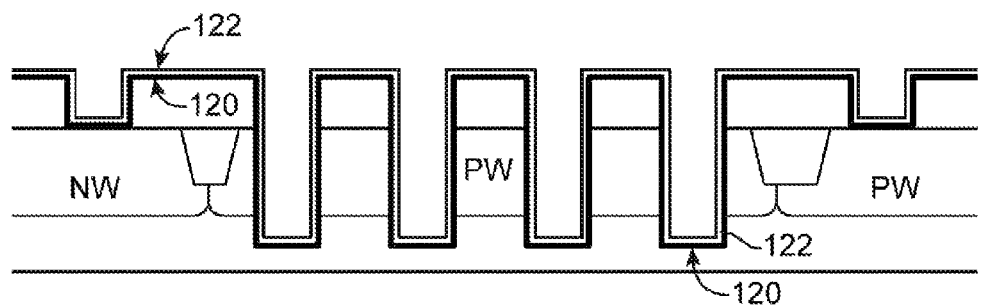
FIGS. 7A, 7B, 7C, and 7D are cross-sectional side views showing steps involved in simultaneously forming decoupling capacitor gate structures and transistor gate structures in accordance with an embodiment of the present invention.

In one suitable arrangement of the present invention, deep trench structures 14 and transistor gate structures may be formed in parallel. As shown in FIG. 7A, a blanket high-κ dielectric layer 120 may be formed over device 10 (into the transistor gate cavities and the decap trench cavities) using deposition techniques such as atomic layer deposition (ALD), molecular beam epitaxy (MBE), electrochemical deposition (ECD), chemical vapor deposition (CVD), physical vapor deposition (PVD), or other types of coating techniques. P-metal layer 122 may then be formed over layer 120 using any suitable deposition technique.

Figure 7B:
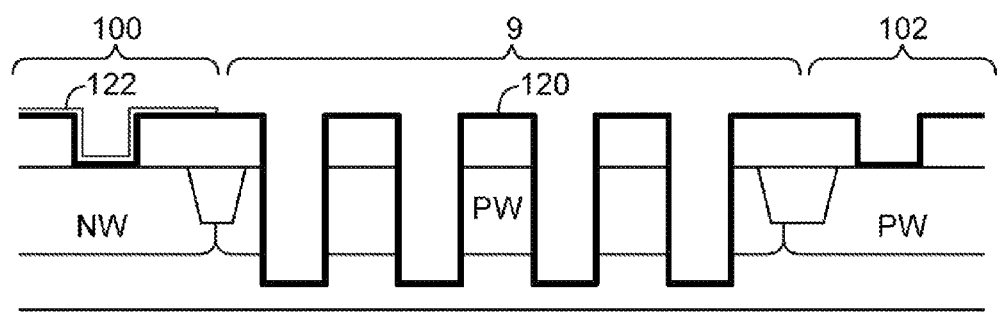

P-metal material 122 may be selectively removed using suitable etching techniques from portions of device 10 other than regions associated with p-channel devices (e.g., devices formed in n-wells), as shown in the cross-sectional snapshot of FIG. 7B.

Figure 7C:
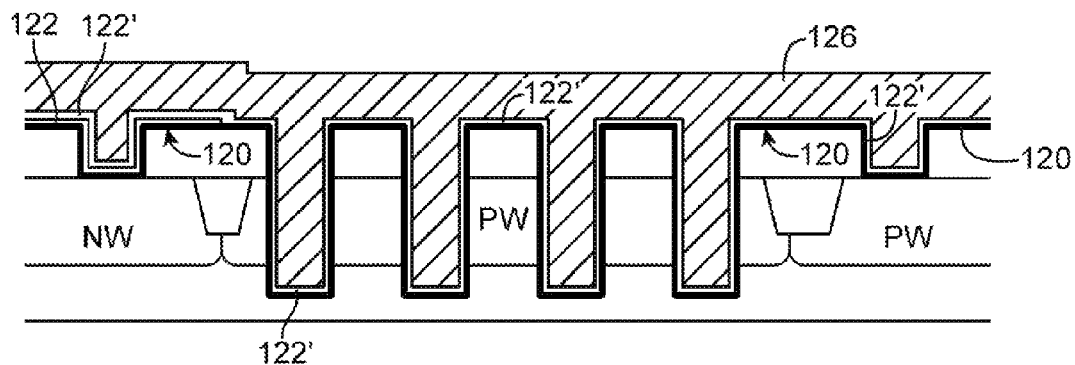

A blanket N-metal layer 122' may subsequently be formed over device 10 (as shown in FIG. 7C). It may be desirable to have N-metal layer 122' be formed over layer 120 for n-channel devices or devices that are formed in p-wells. Conductive fill material 126 may then be formed over device 10.

Figure 7D:
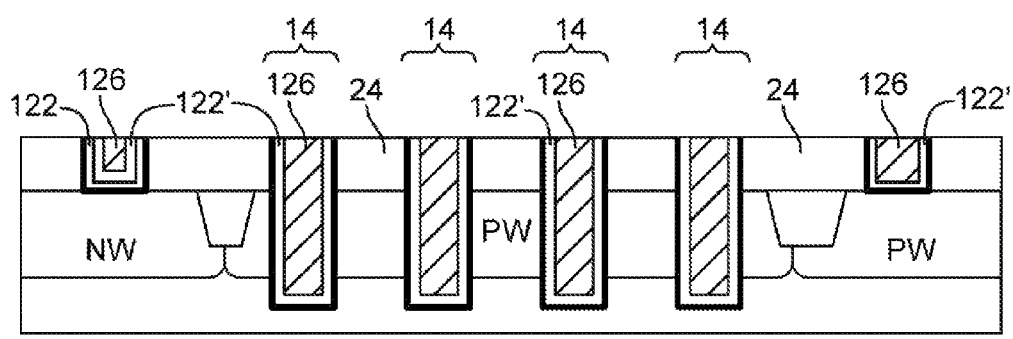

Planarization techniques such as chemical-mechanical polishing (CMP) may then be applied to remove excessive conductive/dielectric material protruding beyond the upper surface of oxide layer 24 (see, e.g., cross-sectional snapshot of FIG. 7D). At this point, deep trench structures 14 of decap structure 9 and the metal gate structures for the p-channel and n-channel transistors are complete. Subsequent processing steps may involve forming diffusion regions for the transistors (e.g., n+ diffusion regions for the n-channel transistors and p+ diffusion regions for the p-channel transistors), forming contacts to the diffusion regions, forming contacts to the p-wells of the decap structures, routing the metal gates of the transistors and the two terminals of the decoupling capacitor structures to desired locations on device 10, etc.

Figure 8:
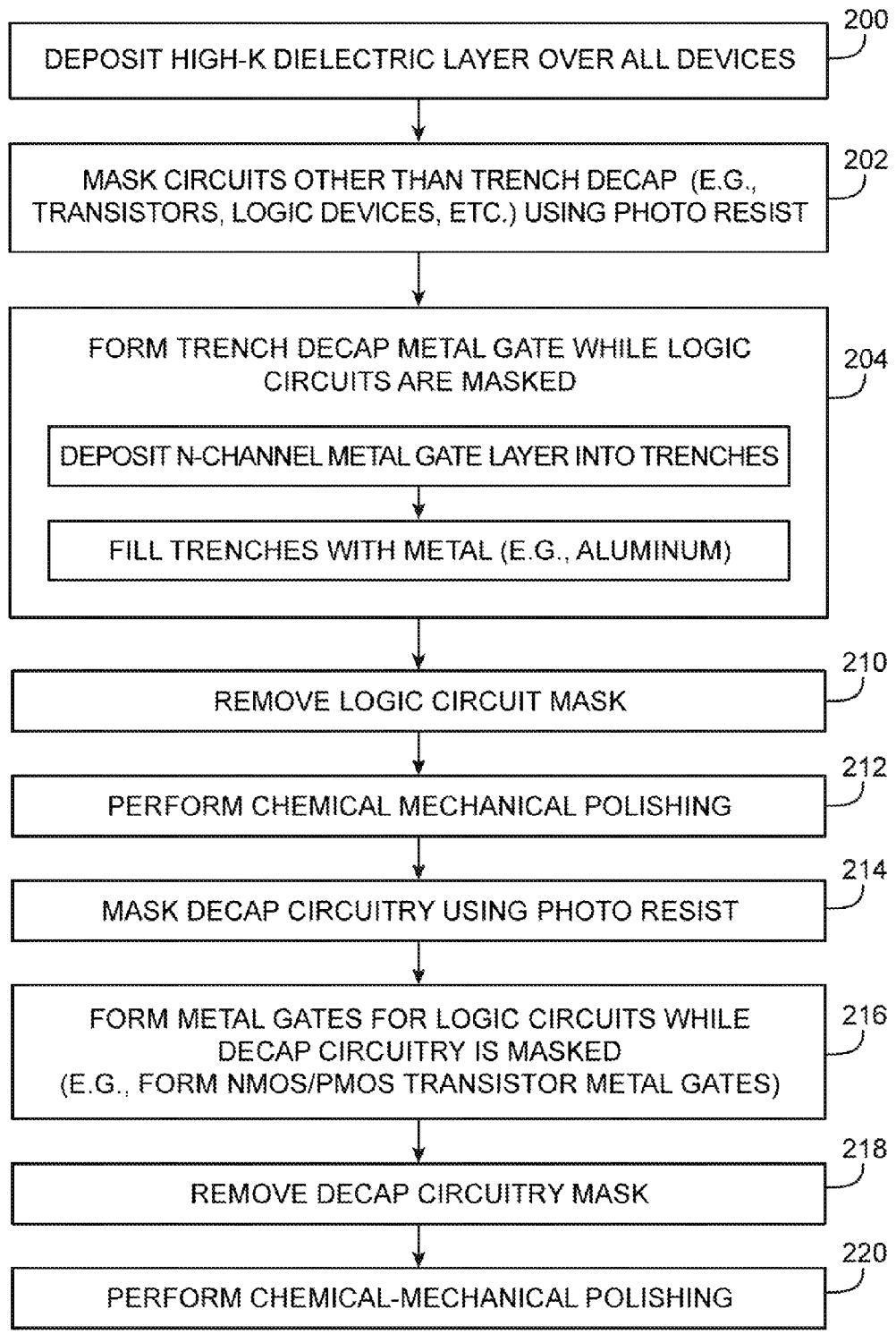
FIG. 8 is a flow chart of illustrative steps involved in forming decoupling capacitor gate structures separately from transistor gate structures in accordance with an embodiment of the present invention.

In another suitable embodiment of the present invention, deep trench structures 14 and the transistor gate structure may be formed separately. FIG. 8 is a flow chart of illustrative steps involve in separately forming the metal gate structures for trench structures 14 and the transistors. At step 200 (i.e., a step to be performed after the step shown in FIG. 6), layer 120 may be deposited using ALD (as an example) over all devices on integrated circuit 10.

At step 202, circuitry other than deep trench decap structures 9 may be covered by forming a first photoresist mask over the transistors, logic gates, and other circuits in circuitry 4 (e.g., decap structures 9 may not be covered with photoresist). At step 204, deep trench structures 14 may be fabricated (e.g., by depositing N-metal layer 122' over layer 120 and by filling the remaining trench cavity with aluminum). At step 210, the first photoresist mask formed in step 202 may be stripped. At step 212, chemical mechanical polishing may be applied to remove excess conductive/dielectric material that protrudes above the top surface of oxide layer 24. Deep trench structures 14 resulting from step 212 may be similar to that shown in FIG. 7D. The transistor metal gates, however, have not yet been formed.

At step 214, decap structures 9 may be covered using a second photoresist mask. At step 216, the metal gates of the n-channel devices and the metal gates of the p-channel devices may be formed. In particular, the metal gate of the p-channel devices and the metal gate of the re-channel devices may be formed separately using steps described in connection with FIGS. 7B, 7C, and 7D (except decap circuitry 9 is covered with the second photoresist mask). If desired, N-metal associated with n-channel devices may be deposited before depositing P-metal.

At step 218, the second photoresist mask formed in step 214 may be stripped. At step 220, chemical mechanical polishing may be applied to remove excess conductive/dielectric material that protrudes above the top surface of oxide layer 24. Transistor metal gate structures resulting from step 220 may be similar to that shown in FIG. 7D. At this point, deep trench structures 14 of decap structure 9 and the metal gate structures for the p-channel and n-channel transistors are complete. Subsequent processing steps may involve forming diffusion regions for the transistors (e.g., n+ diffusion regions for the re-channel transistors and p+ diffusion regions for the p-channel transistors), forming contacts to the diffusion regions, forming contacts to the p-wells of the decap structures, routing the metal gates of the transistors and the two terminals of the decoupling capacitor structures to desired locations on device 10, etc.

Figure 9:
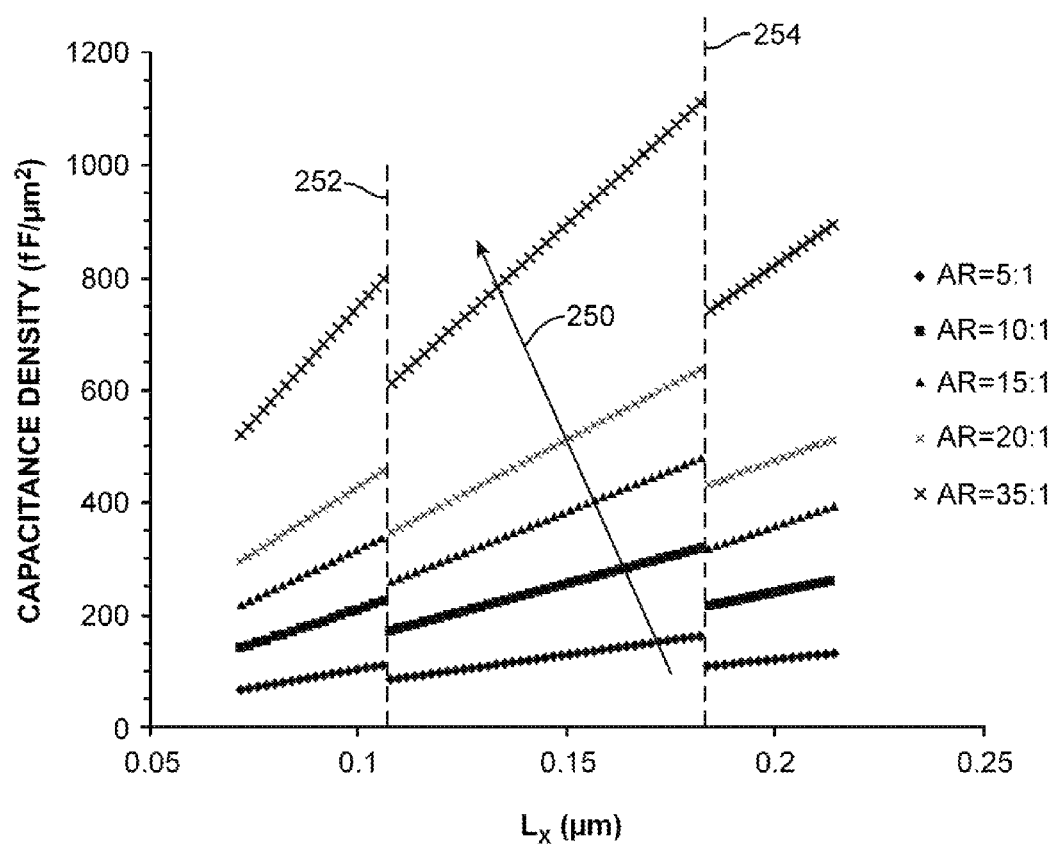
FIG. 9 is a plot of capacitance density versus gate length of each individual trench structure in the decoupling capacitor of the type shown in FIG. 2 in accordance with an embodiment of the present invention.

FIG. 9 is a plot of capacitance density (in units of $fF/\mu m^2$) versus trench width Lx (in units of $\mu m$). As shown in FIG. 9, capacitance density is generally higher for decap structures having trenches with greater aspect ratios (as indicated by trend arrow 250). Within certain ranges, capacitance density increases as Lx increases. Transition points marked by lines 252 and 254 denote trench widths at which the number of trenches in a given decap well region decreases by at least one. For example, a given decap well region 12 may be configured to contain eight deep trench structures 14 if Lx is set to 0.1 μm. If Lx is increased to 0.12 μm, due to area constraints, only seven deep trench structures 14 may be formed in given region 12 (thus dropping the capacitance per unit area by a predictable amount). A designer of decap structures 9 may utilize knowledge of this tradeoff to further optimize the design of decap blocks 8.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for fabricating a capacitor on an integrated circuit comprising:
   forming a transistor gate cavity on a top surface of a substrate;
   forming a capacitor trench cavity in the substrate; and
   simultaneously forming a dielectric liner in at least the transistor gate cavity and the capacitor trench cavity on the integrated circuit, wherein at least part of the dielectric liner in the transistor gate cavity is formed on the top surface of the substrate, and wherein at least part of the dielectric liner in the capacitor trench cavity is formed below the top surface of the substrate.

2. The method defined in claim 1 wherein the dielectric liner is formed using material having a dielectric constant that is greater than that of silicon oxide.

3. The method defined in claim 2 wherein the dielectric liner comprises hafnium oxide.

4. The method defined in claim 1 wherein simultaneously forming the dielectric liner in the transistor gate cavity and the capacitor trench cavity comprises simultaneously depositing the dielectric liner in the transistor gate cavity and the capacitor trench cavity on the integrated circuit using a deposition technique selected from the group consisting of: atomic layer deposition, molecular beam epitaxy, electrochemical deposition, chemical vapor deposition, and physical vapor deposition.

5. The method defined in claim 1 further comprising:
   forming a conductive layer on the dielectric liner.

6. The method defined in claim 5 wherein the conductive layer comprises titanium nitride.

7. The method defined in claim 5 further comprising:
   filling the transistor gate cavity and the capacitor trench cavity with conductive material.

8. A method for fabricating a capacitor on an integrated circuit comprising:
   forming a transistor gate cavity on a top surface of a substrate;
   forming a capacitor trench cavity in the substrate;
   simultaneously forming a dielectric liner in at least the transistor gate cavity and the capacitor trench cavity on the integrated circuit;
   forming a conductive layer on the dielectric liner; and
   selectively removing at least a portion of the conductive layer from the capacitor trench cavity while leaving the conductive layer on the gate transistor cavity intact.

9. A method for fabricating a capacitor comprising:
   forming at least a first density compliance structure that is associated with a transistor in a first region on a substrate;
   forming at least a second density compliance structure that is associated with the capacitor in a second region on the substrate, wherein the first and second density compliance structures are formed from conductive material;
   simultaneously removing the first density compliance structure from the first region on the substrate and the second density compliance structure from the second region on the substrate; and while a portion of regions other than the second region is covered only with a layer of oxide, forming trenches in the substrate at the second region.

10. The method defined in claim 9 further comprising:
forming masking material over the first region while leaving the second region exposed, wherein the masking material comprises photoresist.

11. The method defined in claim 10 wherein forming the trenches in the substrate at the second region comprises forming the trenches at the second region while the masking material is covering the first region.

12. The method defined in claim 11 further comprising: removing the masking material.

13. The method defined in claim 12 further comprising:
simultaneously depositing a dielectric liner in at least the first and second regions.

14. The method defined in claim 13 wherein the dielectric liner is formed using material having a dielectric constant that is substantially greater than that of silicon oxide.

15. The method defined in claim 14 further comprising:
forming a first conductive material of a first type over the dielectric liner; and
forming a second conductive material of a second type that is different than the first type over the first conductive material.

16. A method for fabricating a capacitor on an integrated circuit comprising:
forming at least a first density compliance structure that is associated with a transistor on a substrate;
forming at least a second density compliance structure that is associated with the capacitor in a capacitor region on the substrate, wherein the first and second density compliance structures are formed from conductive material;
simultaneously removing the first and second density compliance structures from selected regions on the substrate; and
forming the capacitor in the capacitor region where the second density compliance structure was removed.

17. The method defined in claim 16, wherein the integrated circuit further comprises regions other than the selected regions that are covered with oxide material, the method further comprising:
forming a masking layer over a first portion of the integrated circuit that is associated with the transistor while leaving a second portion of the integrated circuit that is associated with the capacitor exposed.

18. The method defined in claim 17 further comprising:
forming trenches in the selected regions that are part of the second portion of the integrated circuit using semiconductor etching techniques.

19. The method defined in claim 18 further comprising:
removing the masking layer; and
forming a dielectric liner in the selected regions associated with the transistor and the capacitor.

20. The method defined in claim 19 wherein the dielectric liner is formed using material having a dielectric constant that is at least two times greater than that of silicon oxide.

* * * * *